United States Patent
Kaiser et al.

(10) Patent No.: US 6,728,902 B2
(45) Date of Patent: Apr. 27, 2004

(54) INTEGRATED CIRCUIT HAVING A SELF-TEST DEVICE FOR CARRYING OUT A SELF-TEST OF THE INTEGRATED CIRCUIT

(75) Inventors: Robert Kaiser, Kaufering (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 576 days.

(21) Appl. No.: 09/767,393

(22) Filed: Jan. 23, 2001

(65) Prior Publication Data
US 2001/0011904 A1 Aug. 9, 2001

Related U.S. Application Data

(63) Continuation of application No. PCT/DE99/02069, filed on Jul. 5, 1999.

(30) Foreign Application Priority Data
Jul. 23, 1998 (DE) .......................... 198 33 208

(51) Int. Cl.[7] ................................ G06F 11/00
(52) U.S. Cl. ........................ 714/30; 714/733
(58) Field of Search ................ 714/30, 733, 724, 714/27, 32, 25; 702/183; 701/31

(56) References Cited

U.S. PATENT DOCUMENTS

| | | | |
|---|---|---|---|
| 4,482,953 A | | 11/1984 | Burke |
| 4,607,366 A | | 8/1986 | Stadlmeier et al. |
| 5,173,906 A | | 12/1992 | Dreibelbis et al. |
| 5,537,052 A | * | 7/1996 | Wilson et al. ............... 324/763 |
| 5,619,512 A | * | 4/1997 | Kawashima et al. ........ 714/733 |
| 6,014,763 A | * | 1/2000 | Dhong et al. ............... 714/724 |
| 6,131,174 A | * | 10/2000 | Fischer et al. .............. 714/733 |
| 6,427,216 B1 | * | 7/2002 | El-Kik et al. ............... 714/726 |
| 6,577,979 B1 | * | 6/2003 | Okitaka ....................... 702/117 |
| 2001/0054166 A1 | * | 12/2001 | Fukuda ........................ 714/733 |

FOREIGN PATENT DOCUMENTS

| | | |
|---|---|---|
| EP | 0 018 736 A1 | 11/1980 |
| EP | 0 827 080 A2 | 3/1998 |

\* cited by examiner

Primary Examiner—Robert Beausoliel
Assistant Examiner—Marc Duncan
(74) Attorney, Agent, or Firm—Laurence A. Greenberg; Werner H. Stemer; Gregory L. Mayback

(57) ABSTRACT

An integrated circuit includes a self-test device which is provided for executing a self-test of the integrated circuit and which has a control output. A program memory is connected to the self-test device for storing at least one test program supplied from outside the integrated circuit. The test program is run by the self-test device during execution of a self-test. The self-test device controls loading of a respective test program to be run into the program memory from outside the integrated circuit through the control output thereof.

3 Claims, 1 Drawing Sheet

INTEGRATED CIRCUIT HAVING A SELF-TEST DEVICE FOR CARRYING OUT A SELF-TEST OF THE INTEGRATED CIRCUIT

CROSS-REFERENCE TO RELATED APPLICATION

This application is a continuation of copending International Application No. PCT/DE99/02069, filed Jul. 5, 1999, which designated the United States.

BACKGROUND OF THE INVENTION

FIELD OF THE INVENTION

The invention relates to an integrated circuit having a self-test device for carrying out a self-test of the integrated circuit.

Such an integrated circuit is described, for example, in U.S. Pat. No. 5,173,906. The self-test device (built-in self-test) subjects certain circuit components of the integrated circuit to a test and after that test has been completed a result signal is transmitted outside the integrated circuit.

Self-test devices can be implemented either as wired logic or through the use of a controller or processor which processes an appropriate test program. In the latter case it is possible to feed various test programs into the self-test device in succession from the outside. The test programs each permit different tests to be executed. That procedure may be problematic, in particular if a large number of integrated circuits are to be subjected to a self-test simultaneously. Even with integrated circuits of the same type, different program running times for the test programs which are to be carried out in succession may in fact occur depending on the way in which the test runs. If the individual test programs are supplied by a central external control unit and the loading of the respective successive test programs into the individual integrated circuits is intended to be carried out simultaneously in each case by the control unit, it is necessary to initially wait for the preceding test program in all of the relevant integrated circuits to be completed. That means that the execution of the next respective test program cannot be started until all of the integrated circuits have previously completed the preceding test program. That procedure, which is respectively tailored to the longest possible program execution time, leads to a long period of time being required for the execution of all of the test programs.

SUMMARY OF THE INVENTION

It is accordingly an object of the invention to provide an integrated circuit having a self-test device for carrying out a self-test of the integrated circuit, which overcomes the hereinafore-mentioned disadvantages of the heretofore-known devices of this general type and in which it is possible for the self-test to be performed on a large number of such circuits in less time.

With the foregoing and other objects in view there is provided, in accordance with the invention, an integrated circuit, comprising a self-test device for carrying out a self-test of the integrated circuit. The self-test device has a control output. A program memory is connected to the self-test device for storing at least one test program supplied from outside the integrated circuit and executed while the self-test device carries out a self-test. The self-test device uses the control output to control loading of a respective test program to be executed, from outside the integrated circuit into the program memory.

Therefore, in the invention, the loading of the test program into the program memory of the integrated circuit does not take place under the control of an external control unit but rather automatically through the use of the self-test device located on the chip. This has the advantage that there is no need for an external control unit to control the supplying of the test programs. All that is necessary is one external program memory from which the self-test device can call the respectively required test program through its control output.

The execution of a plurality of test programs which are to be successively executed and loaded into the program memory in succession is carried out in the integrated circuit according to the invention in a time-optimized manner. That is because the control is carried out by the self-test device which actually carries out the self-test.

The integrated circuit may be any desired integrated circuit such as, for example, a memory circuit or a logic circuit. The self-tests do not differ in this case in type from known self-tests. The invention differs from them in terms of the control of the loading of the test programs into the program memory of the integrated circuit.

In accordance with another feature of the invention, the self-test device executes a plurality of test programs in succession and, after completion of the preceding test program, automatically loads the respectively next test program into the program memory from outside the integrated circuit, by control through its control output.

This has the advantage of causing the self-test device to supply the test programs to the program memory according to requirements, specifically directly after completion of the previously executed test program. As a result there is no time loss between the execution of the different test programs, irrespective of how long the self-test device is required to carry out the respective test. This time period is dependent on the way in which the respective test runs, so that the integrated circuit according to the invention can react flexibly to different program running times and no delay times are produced between the execution of successive test programs.

The invention is advantageous in particular if, as described at the outset, a large number of identical integrated circuits carry out a self-test simultaneously. Since each integrated circuit automatically controls the supplying of the next respective test program, the integrated circuits are independent of one another in terms of the starting of the processing of the respectively following test program. Even if all of the integrated circuits process the same test programs in succession, it is possible, as already mentioned, for different program running times to occur in the different circuits. This is due to the way in which the test runs and is dependent, for example, on whether or not an error is detected at an early point during the processing of a test program. In the aforesaid case, a test program can possibly be completed early. In the case of a large number of test programs which are to be carried out in succession, under certain circumstances on each occasion it will be a different circuit of the integrated circuits which are to be tested simultaneously that will require the most time to execute the respective program. This results in an overall harmonization of the test duration as a whole for all of the integrated circuits which are to be tested simultaneously. Thus, the invention is capable of minimizing the overall test duration for all of the integrated circuits.

In accordance with a concomitant feature of the invention, the self-test device has a result signal output through which a common result signal for tests having been carried out in accordance with the executed test programs is supplied outside the integrated circuit after execution of a plurality of test programs having been loaded in succession into the program memory from outside the integrated circuit.

Other features which are considered as characteristic for the invention are set forth in the appended claims.

Although the invention is illustrated and described herein as embodied in an integrated circuit having a self-test device for carrying out a self-test of the integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
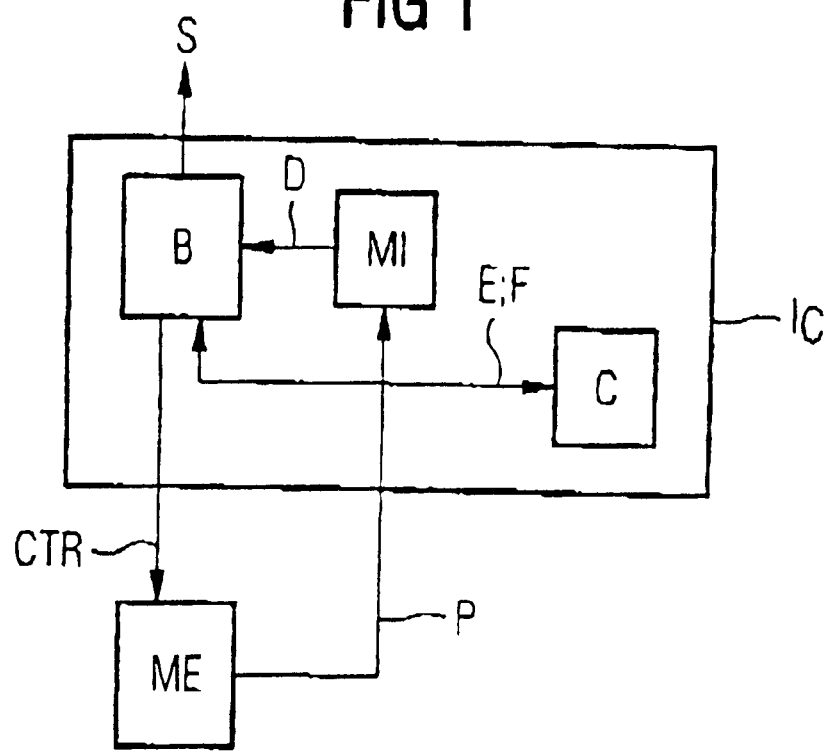
FIG. 1 is a block circuit diagram of a first exemplary embodiment of the invention.

Referring now to the figures of the drawings in detail and first, particularly, to FIG. 1 thereof, there is seen an integrated circuit $I_c$ with a self-test device B, an internal program memory MI and a circuit unit C which is to be tested. The self-test device B is a controller or processor for carrying out a self-test of the circuit unit C (built-in self-test). The self-test device B tests the circuit unit C according to a test program P which is stored in the internal program memory MI. In order to do this, program instructions D of the test program P are transmitted from the internal program memory MI to the self-test device B. The self-test device B then transmits appropriate test signals E to the circuit unit C and in response receives appropriate response signals F from the circuit unit C. These response signals F are compared with expected reference values in the self-test device B. After the self-test has been terminated, the self-test device B transfers a result signal S to outside the integrated circuit IC. The result signal S provides information on the results of all of the tests which have been carried out previously.

FIG. 1 also shows an external program memory ME which is used to store a plurality of test programs P. The self-test device B of the integrated circuit IC has a control output CTR which is connected to a control input of the external program memory ME. Furthermore, a data output of the external program memory ME is connected to a data input of the internal program memory MI of the integrated circuit IC. The control output CTR of the self-test device B transfers control signals to the external program memory ME. The program memory ME transfers the respectively desired test program P to the internal program memory MI as a function of the control signals from the self-test device B. The self-test device B is thus capable of automatically determining the time at which a test program P that is to be respectively executed is to be loaded into the internal program memory MI. The self-test device B of the integrated circuit IC therefore has a master function with respect to the external program memory ME. The loading of a test program can take place, for example, during the activation of the integrated circuit IC whenever it is being initialized. Then, the self-test device B contains a circuit group for detecting an appropriate initialization signal.

In the present case, the self-test device B tests the circuit component C through the use of a large number of test programs P which are to be carried out in succession. For this purpose, the control output CTR of the self-test device B automatically controls the loading of the respectively following test program P into the internal program memory MI after completion of the respectively previous test program P to be executed. In the manner described, a plurality of test programs P are processed in a time-optimized manner without unnecessary waiting times arising between the execution of the different test programs.

The integrated circuit IC illustrated in FIG. 1 advantageously requires no additional external circuit unit for controlling the loading of the test programs P from the external program memory ME into the internal program memory MI. The self-test can thus be carried out by the self-test device B with little expenditure on hardware.

Particular advantages are gained if a large number of integrated circuits, which are structured as illustrated in FIG. 1, carry out a self-test simultaneously. For example, each of the integrated circuits may be assigned a separate external program memory ME in which the same test programs P are stored in each case and to which the respective self-test device B is connected through its control output CTR. Then, the successive test programs P are processed by the different integrated circuits C independently in terms of timing. This is a further advantage in comparison with the controlling of the supplying of the test programs P by an external control unit.

Figure 2:
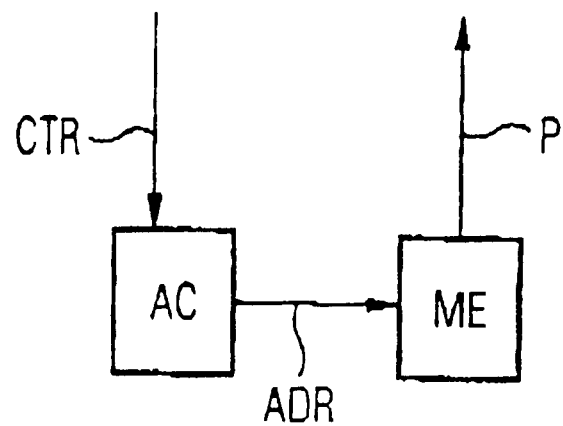
FIG. 2 is a block circuit diagram of a portion of a second exemplary embodiment of the invention.

FIG. 2 shows a portion of an embodiment of the invention which is an alternative to FIG. 1 and which differs from it only in terms of the components illustrated in FIG. 2. The control output CTR of the self-test device B in FIG. 2 is connected to a control input of an address counter AC which transfers one or more addresses ADR to the external program memory ME as a function of the control signal. The data output of the external program memory ME transfers the test program P, respectively determined by the received addresses ADR, to the internal program memory MI.

The test programs P are processed by the self-test device B in accordance with a working clock which is either generated on the integrated circuit IC itself or is fed to it from the outside through a special clock input.

In the present exemplary embodiments, the result signal S of the self-test device B is transferred to outside the integrated circuit IC after the execution of each of all of the test programs P. In the simplest case, that signal is a result signal which only provides information as to whether or not the integrated circuit IC or the circuit component C tested therein has an error (fail/no-fail-signal).

It is possible to provide for the self-test to be carried out by the self-test device B only in a test operating mode of the integrated circuit IC, in which case the latter can be placed in the test operating mode in a known manner. Known so-called test-mode entries are described, for example, in various JEDEC Standards.

We claim:

1. In an integrated circuit, the improvement comprising:
    a self-test device for carrying out a self-test of the integrated circuit, said self-test device having a control output; and a program memory connected to said self-test device for storing at least one test program supplied from outside the integrated circuit and executed while said self-test device carries out a self-test;

said self-test device using said control output to control loading of a respective test program to be executed, from outside the integrated circuit into said program memory.

2. The integrated circuit according to claim 1, wherein said self-test device executes a plurality of the test programs in succession and, after completion of a preceding test program, automatically loads a respective next test program into said program memory from outside the integrated circuit, by control through said control output.

3. The integrated circuit according to claim 2, wherein said self-test device has a result signal output through which a common result signal for tests having been carried out in accordance with the executed test programs is supplied outside the integrated circuit after execution of a plurality of test programs having been loaded in succession into said program memory from outside the integrated circuit.

* * * * *